(12) United States Patent
Shin et al.

(10) Patent No.: US 7,911,875 B2
(45) Date of Patent: Mar. 22, 2011

(54) ADDRESS COUNTING CIRCUIT AND SEMICONDUCTOR MEMORY APPARATUS USING THE SAME

(75) Inventors: Sang Hoon Shin, Gyeonggi-do (KR); Won Jun Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 257 days.

(21) Appl. No.: 12/345,199

(22) Filed: Dec. 29, 2008

(65) Prior Publication Data

US 2010/0091602 A1    Apr. 15, 2010

(30) Foreign Application Priority Data

Oct. 10, 2008  (KR) .................. 10-2008-0099478

(51) Int. Cl.
*G11C 8/00* (2006.01)
(52) U.S. Cl. ................ 365/236; 365/233.1; 365/230.08; 365/189.07
(58) Field of Classification Search .................. 365/236, 365/233.1, 230.08, 189.07
See application file for complete search history.

(56) References Cited

U.S. PATENT DOCUMENTS

| 6,195,304 | B1 | 2/2001 | Eto et al. |
| 6,765,838 | B2 | 7/2004 | Matsumoto et al. |
| 7,158,434 | B2 | 1/2007 | Hokenmaier |
| 7,719,922 | B2 * | 5/2010 | Fujisawa ............ 365/236 |

FOREIGN PATENT DOCUMENTS

| KR | 1019950015371 A | 6/1995 |
| KR | 1020080001390 A | 1/2008 |

* cited by examiner

*Primary Examiner* — Son Dinh
*Assistant Examiner* — Nam Nguyen
(74) *Attorney, Agent, or Firm* — Ladas & Parry LLP

(57) ABSTRACT

An address counting circuit includes a counter configured to sequentially count from an initial address in response to a clock signal in order to output counted addresses. The address counting circuit also includes a code conversion unit that is configured to output converted addresses such that only one address bit of the converted addresses with respect to the previous converted addresses are toggled to output the converted addresses. The converted addresses output form the code conversion unit do not overlap with one another.

13 Claims, 3 Drawing Sheets

ADDRESS COUNTING CIRCUIT AND SEMICONDUCTOR MEMORY APPARATUS USING THE SAME

CROSS-REFERENCES TO RELATED APPLICATION

The present application claims priority under 35 U.S.C. §119(a) to Korean application number 10-2008-0099478, filed on Oct. 10, 2008, in the Korean Intellectual Property Office, which is incorporated herein by reference in its entirety as set forth in full.

BACKGROUND OF THE INVENTION

The present invention relates generally to a counting circuit, and more particularly, to an address counting circuit and a semiconductor memory apparatus using the same.

In a semiconductor memory apparatus, stored data can be subsequently lost after a period of time due to leakage current. In order to cope with this problem and to keep the data from being lost, a refresh operation is performed.

Generally, the types of refresh operations include an auto refresh operation, which is performed in response to a command applied from the outside while the semiconductor memory apparatus operates, and a self refresh operation, which is performed periodically while the semiconductor memory apparatus is in a standby state.

When the semiconductor memory apparatus performs the self refresh operation, an address counting circuit for generating row addresses is needed. After the address counting circuit generates one row address, it sequentially generates row addresses in the following cycles that are counted up or down by one bit.

In addition to a refresh operation, there are various situations in the operation of a semiconductor memory apparatus (for example, a test mode) in which address counting is required. The configuration of a conventional address counting circuit for performing the address counting will be described below.

FIG. 1 is a block diagram showing a conventional address counting circuit.

Referring to FIG. 1, an address counting circuit 10 includes a counter 110 and an amplification unit 120.

As a clock signal 'Clk' is inputted to start address counting, the counter 110 counts up or down an initial address by one bit and sequentially outputs counted addresses.

The counted addresses are inputted to the amplification unit 120, and after being amplified to preset levels, are outputted as amplified addresses.

In this regard, since the counted addresses outputted from the counter 110 are obtained by sequentially increasing or decreasing addresses by one bit, situations arise in which several bits of an address are simultaneously toggled.

For example, when an initial address 00000 of five bits is sequentially increased by one bit, after the address is increased to 01111, all of the five bits must be toggled to increase the address to 10000.

Further, because the amplification unit 120 should amplify the respective bits of the counted addresses to the preset levels, the more the number of the bits that are toggled, the more the current consumption of the amplification unit 120.

Specifically, during a self refresh operation, current for driving a memory bank, current for counting addresses to refresh all word lines, and current for amplifying counted addresses are required. Among these currents, the amount of current required for amplifying the counted addresses is relatively greater than the amount of current required for counting the addresses, and thus the increase in current consumption of the amplification unit can be considered a major cause of an increase in the overall current consumption of a semiconductor memory apparatus.

Currently, semiconductor memory apparatuses are being included in devices such as mobile terminals, etc., in which low power consumption during the operation of he device is demanded. Accordingly, the large amount of current that is consumed for amplifying counted addresses during self refresh mode can deteriorate the operation efficiency of a semiconductor memory apparatus.

SUMMARY OF THE INVENTION

Embodiments of the present invention include an address counting circuit capable of performing address counting using a decreased amount of current.

Additionally, embodiments include an address counting circuit which can minimize the amount of current required to amplify address signals.

Further, embodiments include a semiconductor memory apparatus capable of decreasing the amount of current required for address counting, and which can thereby minimize the operating current of the semiconductor memory apparatus.

In one aspect, an address counting circuit includes a counter configured to sequentially count from an initial address in response to a clock signal and to output counted addresses; and a code conversion unit configured to output converted addresses by toggling previous counted addresses each by one bit in response to the counted addresses (i.e., generating the converted addresses such that only one address bit of the converted addresses with respect to the previous converted addresses are toggled), wherein the converted addresses do not overlap with one another.

In another aspect, a semiconductor memory apparatus comprises an address counting circuit configured to generate converted addresses by toggling previous counted addresses each by one bit (i.e., generating the converted addresses such that only one address bit of the converted addresses previous to each of the respective converted addresses is toggled), in response to counted addresses sequentially generated from an initial address such that the converted addresses do not overlap with one another, and to output the converted addresses to a memory bank; and an address decoder configured to decode the converted addresses outputted from the address counting circuit and to select word lines.

BRIEF DESCRIPTION OF THE DRAWINGS

The above objects, and other features and advantages will become more apparent after a reading of the following detailed description taken in conjunction with the drawings, in which.

DETAILED DESCRIPTION OF SPECIFIC EMBODIMENTS

Hereafter, embodiments will be described with reference to the accompanying drawings.

Figure 2:
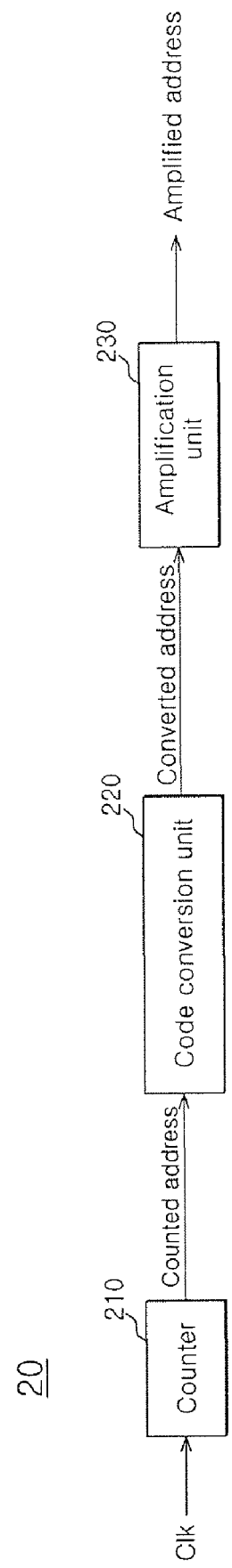
FIG. 2 is a schematic view showing an exemplary address counting circuit according to an embodiment of the present invention.

FIG. 2 is a schematic view showing an exemplary address counting circuit according to an embodiment of the present invention.

Referring to FIG. 2, an address counting circuit 20 can include a counter 210 which is driven by a clock signal 'Clk' and which sequentially increases or decreases an initial address having n bits, a code conversion unit 220 which converts the code of the counted address outputted from the counter 210, and an amplification unit 230 which amplifies the level of the converted addresses outputted from the code conversion unit 220 to a preset level and outputs an amplified address.

In detail, the counter 210 can be configured to sequentially count up or down the initial address having n bits by one bit.

The code conversion unit 220 can perform one bit toggling code conversion of the counted address outputted from the counter 210. In more detail, the code conversion unit 220 can cause current converted addresses to be toggled by one bit with respect to the previous converted addresses in such a manner that the converted addresses generated as a result of the code conversion do not overlap with one another.

To this end, the code conversion unit 220 can comprise, for example, a gray code conversion unit.

The amplification unit 230 can amplify the signal level of the converted addresses outputted from the code conversion unit 220. Since the converted addresses are in a state in which it is toggled by one bit with respect to the previous address, it is sufficient for the amplification unit 230 to perform amplification only for the converted one bit, whereby current consumption for the amplification process can be minimized.

In the address counting circuit 20 shown in FIG. 2, while the amplification unit 230 can be configured inside the address counting circuit 20, the embodiment is not limited thereto. That is to say, the amplification unit 230 can be configured in a variety of possible ways, as long as it is connected with the code conversion unit 220 and amplifies the converted addresses outputted from the code conversion unit 220.

Figure 3:
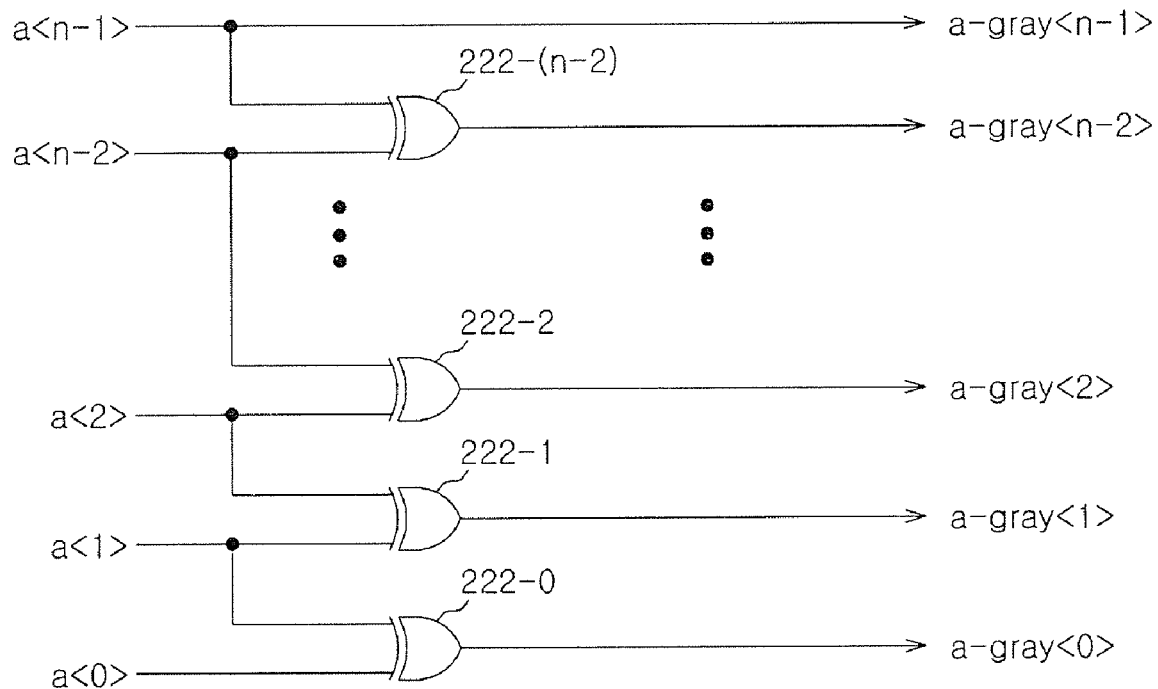
FIG. 3 is a schematic circuit diagram showing an embodiment of a code conversion unit capable of being implemented in the circuit of FIG. 2.

FIG. 3 is a schematic circuit diagram showing an embodiment of a code conversion unit capable of being implemented in the circuit of FIG. 2.

Referring to FIG. 3, the code conversion unit 220 can include n−1 logic elements 222-0 through 222-(n−2) which receive n bits 'a<0>' through 'a<n−1>' of a counted address outputted from the counter 210. The logic elements 222-0 through 222-(n−2) sequentially compare the address bits with neighboring address bits starting from the least significant address bits, and output respective logic high values when the address bits have different levels. Also, the most significant address bit of a counted address is output as the most significant address bit of a converted address. As a result, n bits 'a-gray<0>' through 'a-gray<n−1>' of converted addresses are outputted.

Here, the logic elements 222-0 through 222-(n−2) can comprise XOR gates which perform exclusive ORing logical operation.

For example, when an initial address is a five bit address of 00000 and the counter 210 counts up by one bit, counted addresses 'a<4:0>', the word lines WL selected thereby, and the number of bits that are toggled are as given in Table 1.

TABLE 1

| WL | a<4:0> | Toggle bit Number |
|----|--------|-------------------|
| 0  | 00000  | —                 |
| 1  | 00001  | 1                 |
| 2  | 00010  | 2                 |
| 3  | 00011  | 1                 |
| 4  | 00100  | 3                 |
| 5  | 00101  | 1                 |
| 6  | 00110  | 2                 |
| 7  | 00111  | 1                 |
| 8  | 01000  | 4                 |
| 9  | 01001  | 1                 |
| 10 | 01010  | 2                 |
| 11 | 01011  | 1                 |
| 12 | 01100  | 3                 |
| 13 | 01101  | 1                 |
| 14 | 01110  | 2                 |
| 15 | 01111  | 1                 |
| 16 | 10000  | 5                 |
| 17 | 10001  | 1                 |
| 18 | 10010  | 2                 |
| 19 | 10011  | 1                 |
| 20 | 10100  | 3                 |
| 21 | 10101  | 1                 |
| 22 | 10110  | 2                 |
| 23 | 10111  | 1                 |
| 24 | 11000  | 4                 |
| 25 | 11001  | 1                 |
| 26 | 11010  | 2                 |
| 27 | 11011  | 1                 |
| 28 | 11100  | 3                 |
| 29 | 11101  | 1                 |
| 30 | 11110  | 2                 |
| 31 | 11111  | 1                 |

Further, when the counted addresses 'a<4:0>' are code-converted by the code conversion unit 220 shown in FIG. 3, converted addresses 'a-gray<4:0>', the word lines WL selected thereby, and the number of bits to be toggled are as given in Table 2.

TABLE 2

| WL | a-gray <4:0> | Toggle bit Number |
|----|--------------|-------------------|
| 0  | 00000        | —                 |
| 1  | 00001        | 1                 |
| 3  | 00011        | 1                 |
| 2  | 00010        | 1                 |
| 6  | 00110        | 1                 |
| 7  | 00111        | 1                 |
| 5  | 00101        | 1                 |
| 4  | 00100        | 1                 |
| 12 | 01100        | 1                 |
| 13 | 01101        | 1                 |
| 15 | 01111        | 1                 |
| 14 | 01110        | 1                 |
| 10 | 01010        | 1                 |
| 11 | 01011        | 1                 |
| 9  | 01001        | 1                 |
| 8  | 01000        | 1                 |
| 24 | 11000        | 1                 |
| 25 | 11001        | 1                 |
| 27 | 11011        | 1                 |
| 26 | 11010        | 1                 |
| 30 | 11110        | 1                 |
| 31 | 11111        | 1                 |
| 29 | 11101        | 1                 |
| 28 | 11100        | 1                 |
| 20 | 10100        | 1                 |
| 21 | 10101        | 1                 |
| 23 | 10111        | 1                 |
| 22 | 10110        | 1                 |

TABLE 2-continued

| WL | a-gray <4:0> | Toggle bit Number |
|---|---|---|
| 18 | 10010 | 1 |
| 19 | 10011 | 1 |
| 17 | 10001 | 1 |
| 16 | 10000 | 1 |

Figure 1:
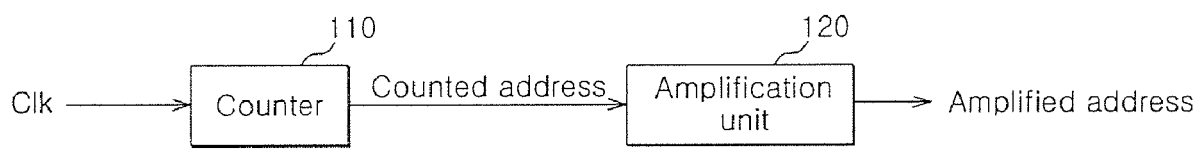
FIG. 1 is a view showing a conventional address counting circuit.

As can be readily seen from Table 1 and Table 2, in the conventional address counting circuit, since the output signals of the counter (see 110 of FIG. 1) given in Table 1 are outputted as they are, when the number of bits to be toggled increases (e.g., the number of toggled bits are often greater than one and need to be amplified), the current consumption of the amplification unit (see 120 of FIG. 1) increases.

However, in the address counting circuit 20 according to the embodiment, the output signals of the counter 210 are converted by the code conversion unit 220 in such a way as to be toggled by only one bit. According to this, the amplification unit 230 need only to perform an amplification operation on the one toggled bit; and therefore, power consumption can be remarkably decreased.

Figure 4:
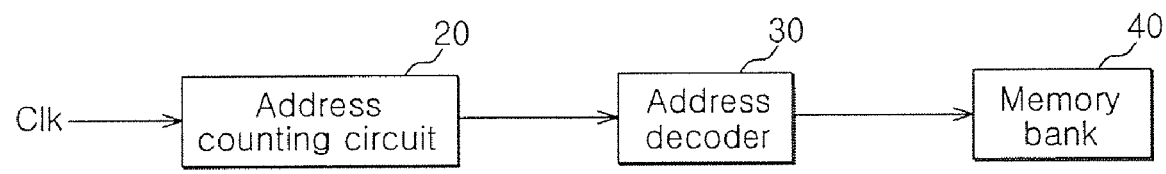
FIG. 4 is a schematic view showing an exemplary semiconductor memory apparatus according to another embodiment of the present invention.

FIG. 4 is a schematic view showing an exemplary semiconductor memory apparatus according to another embodiment of the present invention.

Referring to FIG. 4, a semiconductor memory apparatus can include an address counting circuit 20, an address decoder 30, and a memory bank 40.

The address counting circuit 20 can count an initial address in response to a clock signal 'Clk' and output a counted address to the address decoder 30 in such a manner that a current converted addresses are toggled by one bit with respect to a previous converted addresses and code conversion results do not overlap with one another.

For example, the address counting circuit 20 can be configured as shown in FIG. 2.

In the address counting circuit 20 shown in FIG. 2, while the amplification unit 230 can be configured inside the address counting circuit 20, the embodiment is not limited thereto. Thus, the amplification unit 230 can be configured in a variety of possible ways, as long as it is connected to the code conversion unit 220 (which is included in the address counting circuit 20), amplifies the converted addresses outputted from the code conversion unit 220, and outputs an amplified address to the memory bank 40.

The address decoder 30 selects word lines using the addresses outputted from the address counting circuit 20, by which the memory cells connected to the corresponding word lines of the memory bank 40 are selected.

For example, in the case where a self refresh command is generated in the standby state of the semiconductor memory apparatus, the counter 210 of the address counting circuit 20 sequentially increases or decreases the initial address by one bit in response to the clock signal 'Clk' and outputs counted addresses. The code conversion unit 220 of the address counting circuit 20 performs code conversion in response to the counted addresses in such a manner that a current converted addresses are toggled by one bit with respect to a previous converted addresses and the converted addresses generated as a result of the code conversion do not overlap with one another. The amplification unit 230 amplifies the converted addresses outputted from the code conversion unit 220 and outputs amplified addresses to the address decoder 30 so that word lines can be selected.

If the word lines are selected in the address decoder 30 by the addresses outputted from the address counting circuit 20, the sense amplifiers connected to the selected word lines operate, and the information of the memory cells connected to the corresponding word lines is loaded on bit lines for a predetermined time.

Then, as a sense amplifier enable signal is activated, sense amplifier drivers operate. In this way, power is supplied to a plurality of sense amplifiers, and sensing of a plurality of bit lines is started. By performing this procedure until each of the word lines are selected, self refresh is implemented for the entire memory cells.

In the embodiment, when the address counting circuit 20 for selecting word lines operates, the amount of current consumed when amplifying the levels of address signals can be minimized, whereby the overall operation current of the semiconductor memory apparatus can be reduced.

Currently, in a semiconductor memory apparatus, an address signal has twelve bits, and in this case, the convention art at times can require all of the twelve bits to be toggled and amplified. However, in embodiments of the present invention, it is never necessary to toggle and amplify more than one bit, and therefore the larger the number of bits of an address signal, the more the current saving effect.

In embodiments of the present invention, by code-converting a counted address, the amount of current required to amplify the level of an address signal can be minimized.

As a result, the current consumption can be remarkably decreased in an operation mode such as refresh operation, in which address counting is required, and therefore the operation efficiency of a semiconductor memory apparatus can be improved.

In more detail, the capacity of semiconductor memory apparatuses has gradually increased, and this increase in capacity has required an increase in the number of address bits. When there are a large number of address bits, a large amount of current is required to amplifying the bits toggled during an address counting procedure for refresh operation, etc.

In embodiments of the present invention, a counted address is code-converting in such a way so that only one bit is toggled therefore requiring only one bit to be amplified, and thereby the amount of current required to amplify the level of an address signal can be minimized.

As a result, when a semiconductor memory apparatus is applied to devices such as mobile terminals, large capacity memory devices, etc.; since the semiconductor memory apparatus can operate with low power consumption, the operation efficiency of the semiconductor memory apparatus can be improved.

Although exemplary embodiments have been described for illustrative purposes, those skilled in the art will appreciate that various modifications, additions and substitutions are possible, without departing from the scope and the spirit as disclosed in the accompanying claims.

What is claimed is:

1. An address counting circuit comprising:
   a counter configured to sequentially count from an initial address having a plurality of address bits in response to a clock signal in order to output counted addresses; and
   a code conversion unit configured to receive the counted addresses and to output converted addresses, wherein the code conversion unit outputs the converted addresses such that only one address bit of the converted addresses with respect to the previous converted addresses are toggled to output the converted addresses, wherein the converted addresses do not overlap with one another.

2. The address counting circuit according to claim 1, wherein the code conversion unit comprises one or more logic elements which receive the counted addresses, wherein for each of the counted addresses, each of the address bits thereof is compared to the neighboring address bit starting from the least significant address bit, wherein a logic high value is output as a bit of the converted addresses corresponding to the counted address when the compared neighboring address bits have different levels.

3. The address counting circuit according to claim 2, wherein the code conversion unit outputs the most significant address bits of the respective counted addresses as the most significant address bits of the respective converted addresses.

4. The address counting circuit according to claim 1, wherein the code conversion unit comprises a gray code conversion unit.

5. The address counting circuit according to claim 1, further comprising:
   an amplification unit configured to amplify levels of the converted addresses.

6. The address counting circuit according to claim 5, wherein only the toggled bits of the respective converted addresses are amplified by the amplification unit.

7. A semiconductor memory apparatus comprising:
   an address counting circuit configured to generate converted addresses in response to counted addresses sequentially generated by counting from an initial address, wherein each of the converted addresses are generated such that only one address bit of the converted addresses are toggled with respect to the previous converted address, wherein the converted addresses do not overlap with one another, and the converted addresses are output to a memory bank; and
   an address decoder configured to decode the converted addresses outputted from the address counting circuit and to select word lines.

8. The semiconductor memory apparatus according to claim 7, wherein the address counting circuit comprises:
   a counter configured to sequentially count from the initial address in response to a clock signal in order to output the counted addresses; and
   a code conversion unit configured to receive each of counted addresses and outputting a corresponding one of the converted addresses for each of the counted addresses such that only one address bit of the converted addresses are toggled with respect to the previous converted address.

9. The semiconductor memory apparatus according to claim 8, wherein the code conversion unit comprises one or more logic elements which receive the counted addresses, wherein for each of the counted addresses, each of the address bits thereof is compared to the neighboring address bit starting from the least significant address bit, wherein a logic high value is output as a bit of the corresponding converted addresses when the compared neighboring address bits have different levels.

10. The semiconductor memory apparatus according to claim 9, wherein the code conversion unit outputs the most significant address bits of the respective counted addresses as the most significant address bits of the respective converted addresses.

11. The semiconductor memory apparatus according to claim 8, wherein the code conversion unit comprises a gray code conversion unit.

12. The semiconductor memory apparatus according to claim 8, further comprising:
   an amplification unit configured to amplify levels of the converted addresses outputted from the code conversion unit and to output amplified addresses to the memory bank.

13. The semiconductor memory apparatus according to claim 12, wherein only the toggled bits of the respective converted addresses are amplified by the amplification unit.

* * * * *